United States Patent
Lin et al.

(10) Patent No.: US 7,299,314 B2
(45) Date of Patent: Nov. 20, 2007

(54) FLASH STORAGE SYSTEM WITH WRITE/ERASE ABORT DETECTION MECHANISM

(75) Inventors: Jason Lin, Santa Clara, CA (US); Kevin M. Conley, San Jose, CA (US); Robert C. Chang, Danville, CA (US)

(73) Assignee: SanDisk Corporation, Milpitas, CA (US)

( * ) Notice: Subject to any disclaimer, the term of this patent is extended or adjusted under 35 U.S.C. 154(b) by 245 days.

(21) Appl. No.: 10/751,096

(22) Filed: Dec. 31, 2003

(65) Prior Publication Data

US 2005/0144362 A1    Jun. 30, 2005

(51) Int. Cl.
    *G06F 12/00* (2006.01)
(52) U.S. Cl. ..................... 711/103; 365/185.01
(58) Field of Classification Search ................. 711/103
    See application file for complete search history.

(56) References Cited

U.S. PATENT DOCUMENTS

| | | | |
|---|---|---|---|
| 4,677,606 A | | 6/1987 | Ogata et al. |
| 5,321,651 A | | 6/1994 | Monk |
| 5,576,989 A | | 11/1996 | Kowalski |
| 5,838,614 A | * | 11/1998 | Estakhri et al. ......... 365/185.11 |
| 6,385,744 B1 | * | 5/2002 | Ando et al. ................... 714/54 |
| 6,512,702 B1 | | 1/2003 | Yamamura et al. |
| 6,535,949 B1 | * | 3/2003 | Parker ......................... 711/103 |
| 6,564,307 B1 | * | 5/2003 | Micka et al. ................ 711/156 |
| 6,601,132 B2 | * | 7/2003 | Nomura et al. ............. 711/103 |
| 6,646,921 B2 | | 11/2003 | Roohparvar |
| 6,662,334 B1 | | 12/2003 | Stenfort |
| 2002/0026566 A1 | * | 2/2002 | Awada et al. ............... 711/162 |
| 2002/0069314 A1 | * | 6/2002 | Miyauchi .................... 711/103 |
| 2003/0099134 A1 | | 5/2003 | Lasser et al. |
| 2003/0163663 A1 | * | 8/2003 | Aasheim et al. ............ 711/202 |
| 2004/0095666 A1 | | 5/2004 | Asano et al. |
| 2005/0036390 A1 | | 2/2005 | Nakada et al. |

FOREIGN PATENT DOCUMENTS

WO    WO 03/010671 A1    2/2003

OTHER PUBLICATIONS

Preliminary Notice of Rejection of the IPO, Taiwanese Patent Application No. 093141183, dated May 26, 2006, 4 pages.
Examiner's First Report, European Patent Application No. 04 814 618.7, dated Nov. 6, 2006, 3 pages.

* cited by examiner

*Primary Examiner*—Brian R. Peugh
*Assistant Examiner*—Hashem Farrokh
(74) *Attorney, Agent, or Firm*—Davis Wright Tremaine LLP

(57) ABSTRACT

The present invention presents a non-volatile memory and method for its operation that ensures reliable mechanism for write and erase abort detection in the event of lost of power during non-volatile memory programming and erasing with minimized system performance penalty. During a multi-sector write process, an indication of a successful write in one sector is written into the overhead of the following sector at the same time as the following sector's data content is written. The last sector written will additionally have an indication of its own successful write written into its overhead. For erase, an erase abort flag in the first sector of the block can be marked after a successful erase operation.

20 Claims, 7 Drawing Sheets

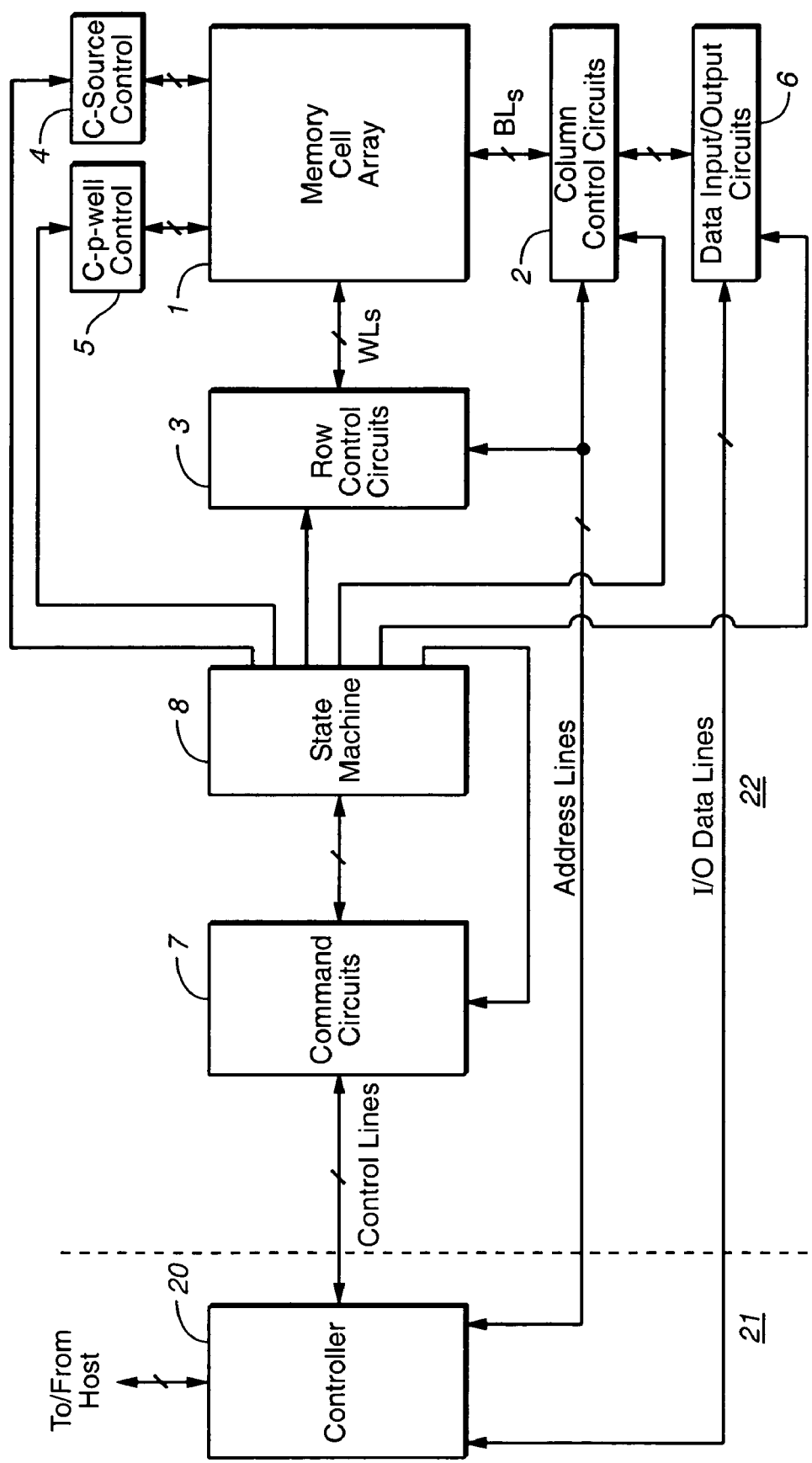
FIG._1

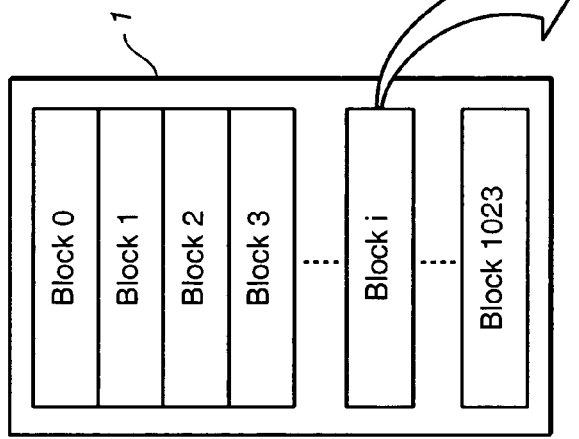
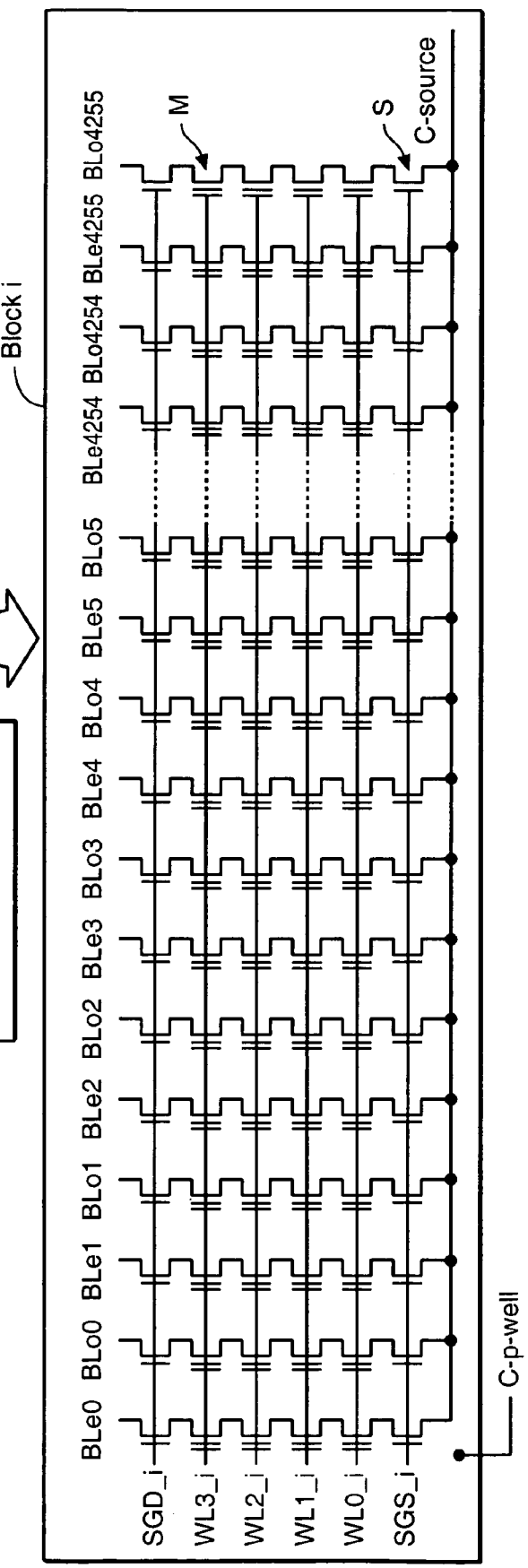
FIG._2

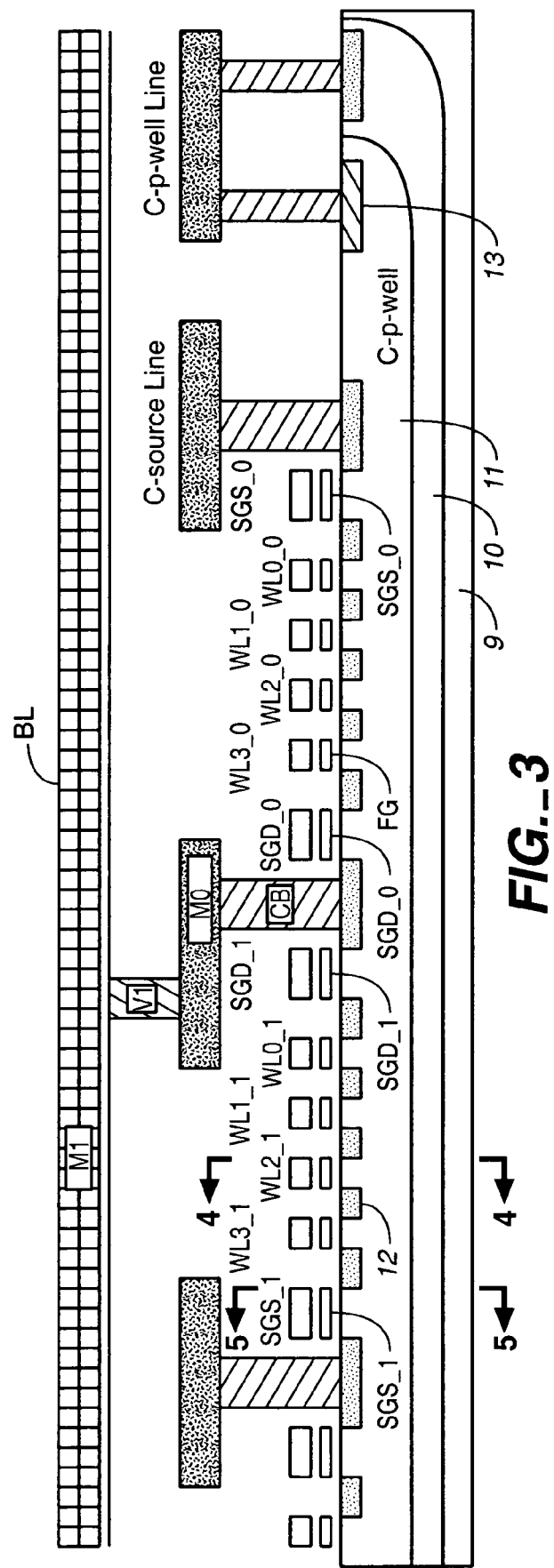
FIG._3

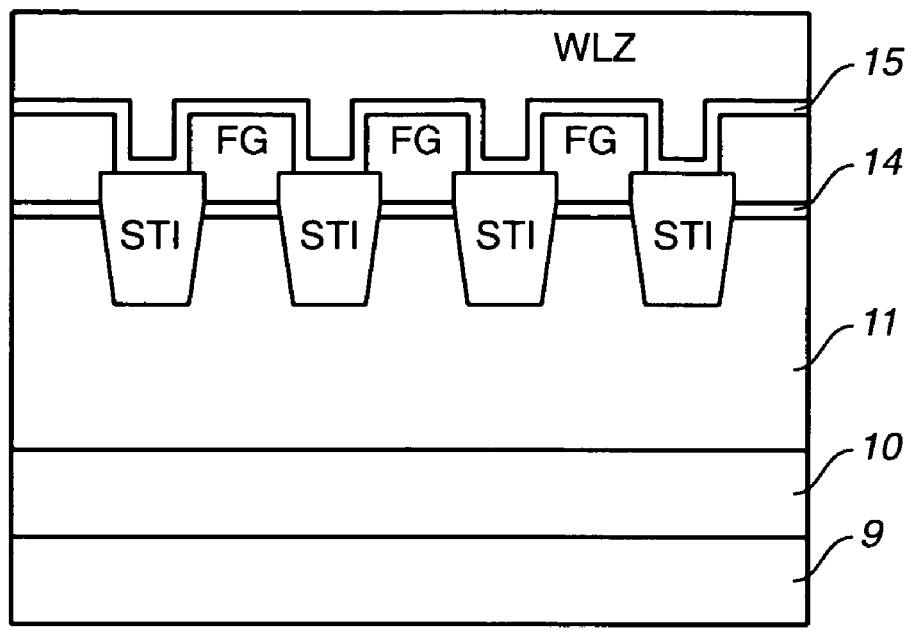
FIG._4
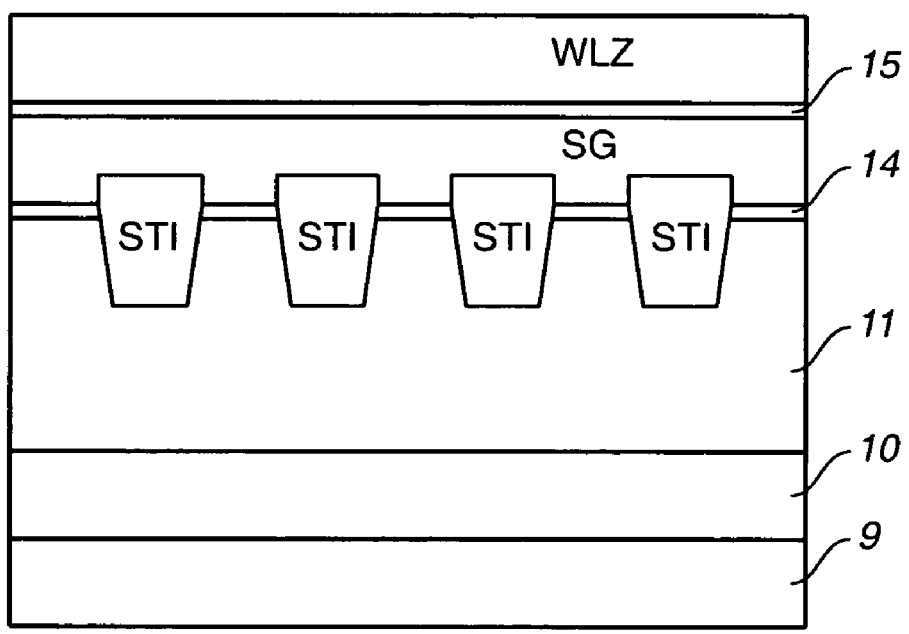
FIG._5

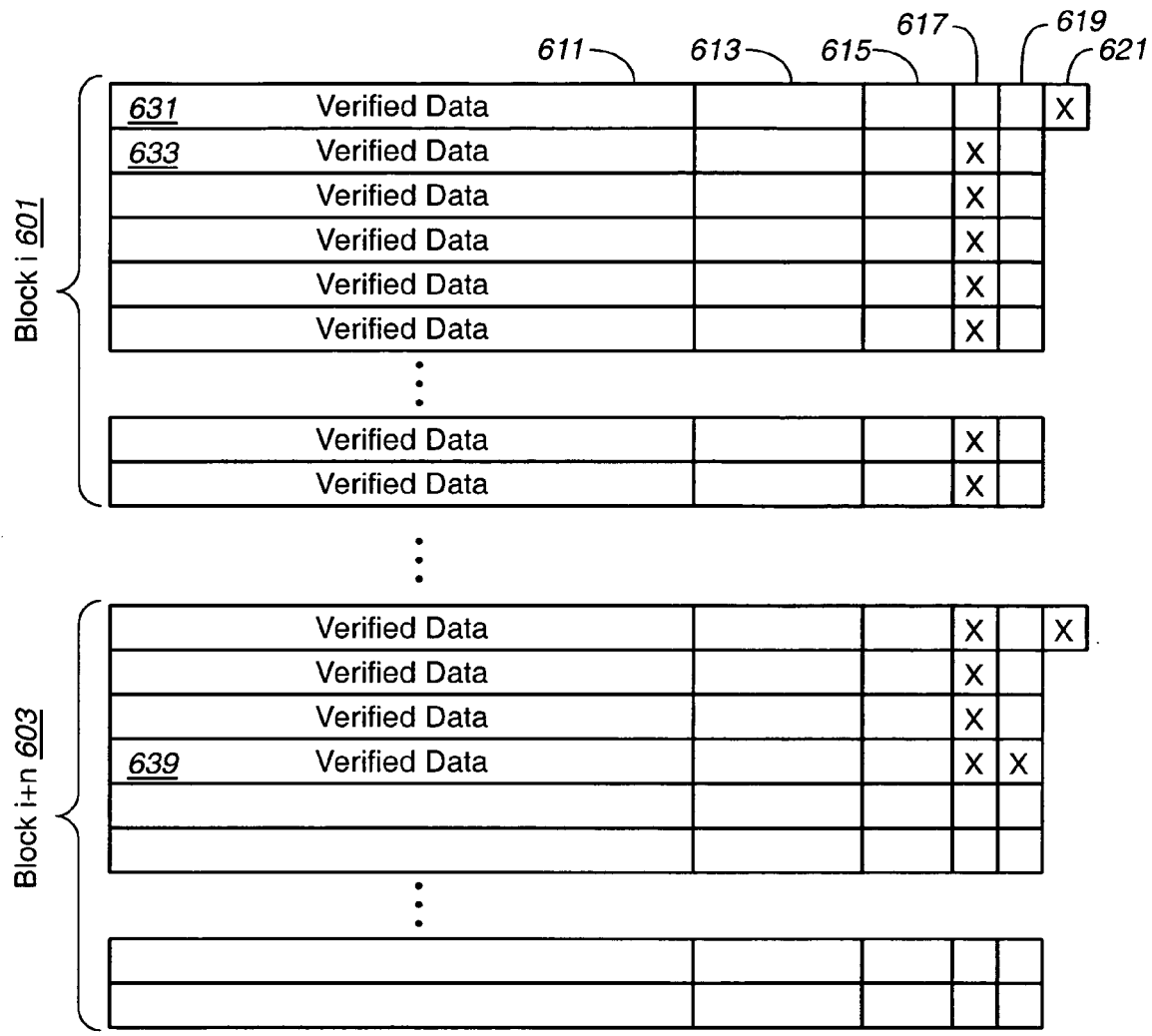
FIG._6A
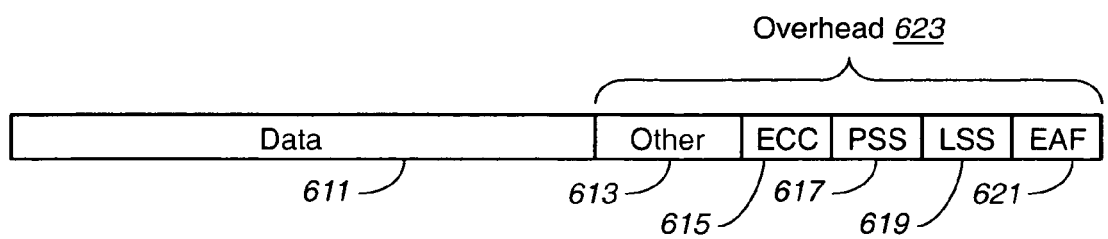
FIG._6B

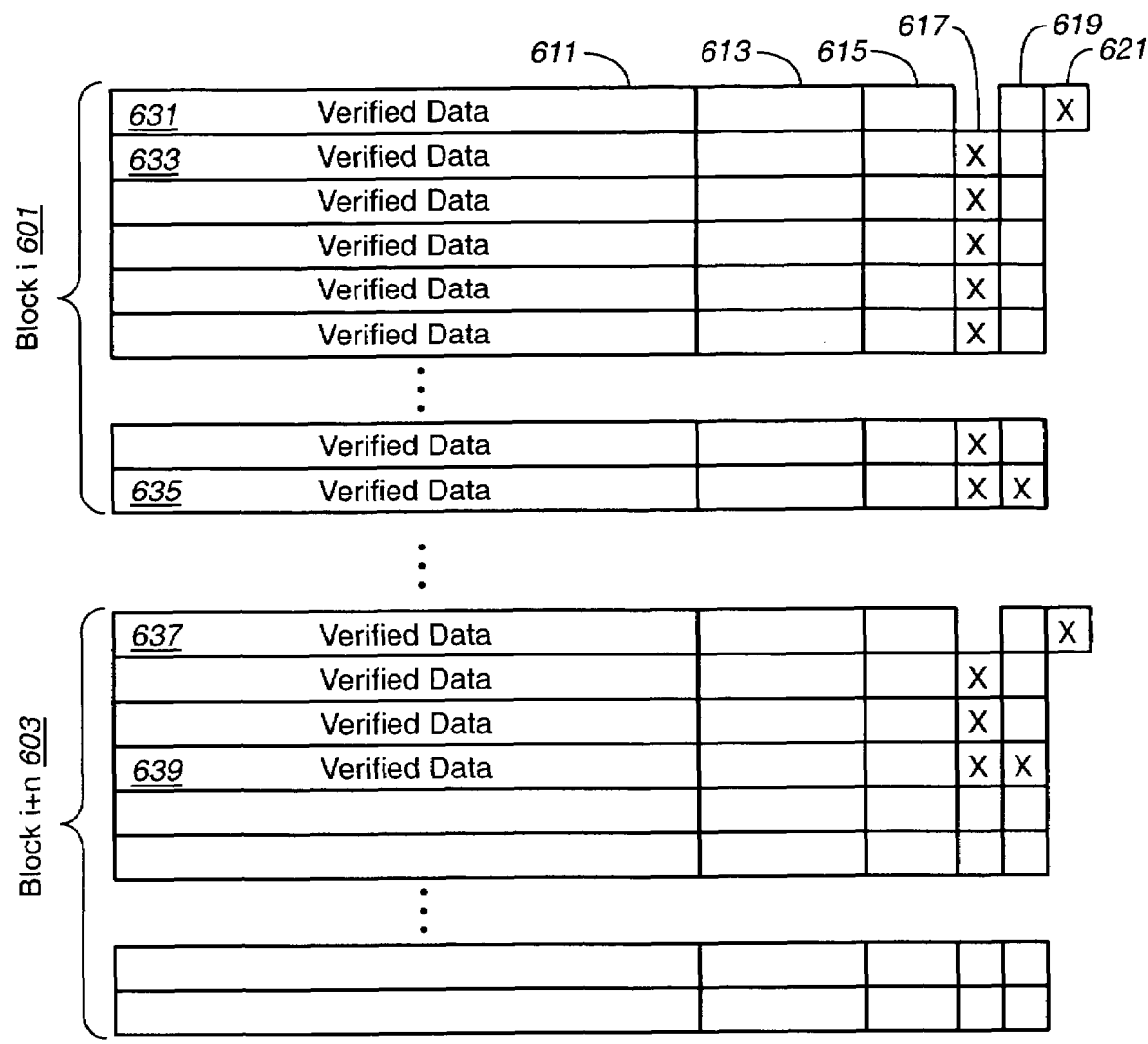
FIG._6C

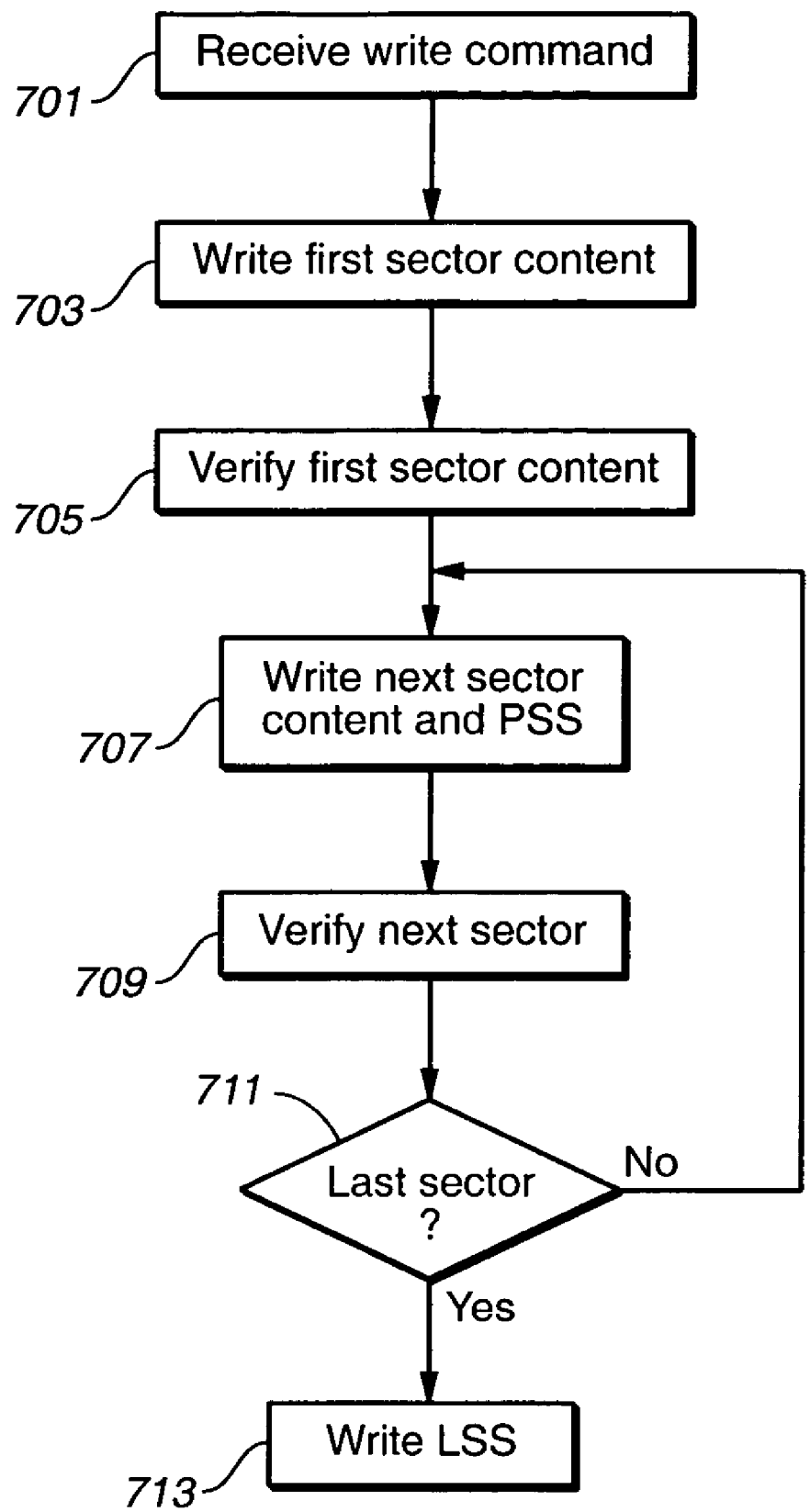
FIG._7

FLASH STORAGE SYSTEM WITH WRITE/ERASE ABORT DETECTION MECHANISM

FIELD OF THE INVENTION

This invention relates generally to a non-volatile memory and its operation, and, more specifically, to determining aborted write and erase operations.

BACKGROUND OF THE INVENTION

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks, wherein a block contains the smallest number of cells (unit of erase) that are erasable at one time.

In one commercial form, each block contains enough cells to store one sector of user data plus some overhead data related to the user data and/or to the block in which it is stored. The amount of user data included in a sector is the standard 512 bytes in one class of such memory systems but can be of some other size. Because the isolation of individual blocks of cells from one another that is required to make them individually erasable takes space on the integrated circuit chip, another class of flash memories makes the blocks significantly larger so there is less space required for such isolation. But since it is also desired to handle user data in much smaller sectors, each large block is often further partitioned into individually addressable pages that are the basic unit for reading and programming user data. Each page usually stores one sector of user data, but a page may store a partial sector or multiple sectors. A "sector" is used herein to refer to an amount of user data that is transferred to and from the host as a unit.

The subsystem controller in a large block system performs a number of functions including the translation between logical addresses received by the memory subsystem from a host, and physical addresses within the memory cell array. This translation often involves use of intermediate terms for a logical block number (LBN) and logical page. The controller also manages the low-level flash circuit operation through a series of commands that it issues to the flash memory devices via an interface bus. Another function the controller performs is to maintain the integrity of data stored to the subsystem through various means, such as by using an error correction code (ECC).

In case of a power outage during operation of such a memory circuit, for example if a memory card is removed from a host or a power is lost to a device with an integrated memory, the memory may be caught in the middle of a write or erase operation, resulting in an incomplete operation. For example, if a memory system loses power during a programming process when most, but not all, of the cells in a group being written have reached their target state, the write group may contain a large number of errors. As is familiar in the art, it is common to incorporate error correction code (ECC) into memory systems to determine and correct data errors. A power outage before completion of a programming operation can cause the write group to be in three situations when the interrupted write group is read: (1) it is correctable by ECC; (2) it is uncorrectable by ECC; and (3) an ECC mis-detect can occur. In the first case, the extent of the error is minor enough where the error correction code can salvage the data. In the second case, the data will be incorrect, but the system will determine this condition. In the third case, the data will again be incorrect, but, due to an ECC mis-detect, the system is unaware of the situation.

This last case, the ECC mis-detect, can occur if, for example, the ECC has the capacity to correct up to, say, 4 bits of error, but 7 bits of data in the write group were not correctly written. The system will then unaware of the incorrectly written data and operate as if it has corrected any error in the write group, but the data will still be wrong. A similar situation can occur if power loss occurs during an erase process. These scenarios make ECC write and erase abort detection far from perfect and are particularly troublesome for mission critical situations where it is important to know if the data has been correctly entered. Consequently, there is room for improvement in this aspect of memory systems.

SUMMARY OF THE INVENTION

According to a first aspect, the present invention presents a non-volatile memory and method for its operation that ensures reliable mechanism for write and erase abort detection in the event of lost of power during non-volatile memory programming and erasing with minimized system performance penalty. In an exemplary embodiment, to ensure a write abort failure can be reliably detected with minimal performance impact, a new write abort detection mechanism is introduced. The algorithm includes a Previous Sector Status flag (PSS) and a Last Sector Status flag (LSS) in the sector overhead information, where the Previous Sector Status flag (PSS) can be protected by ECC.

In a multi-sector write process, writing sectors 0 to x in a block, after programming the data in sector 0, the algorithm will write the PSS of sector 1 along with the data in sector 1 to denote sector 0 has completed programming and no write abort occurred; after sector 1 is programmed, the algorithm will write the PSS of sector 2 along with the data in sector 2 to denote sector 1 has completed programming and no write abort occurred; and so on, until the last sector is programmed. To denote that the last sector has completed programming without a write abort, the LSF of the last sector is written. Consequently, only last sector in the host program command requires two programming operation to ensure write abort detection.

In another aspect of the present invention, the mechanism ensures write abort failure detection by looking at the PSS of next physical sector and at the LSS of current sector is the sector is the last programmed sector in the block or the last physical sector of the block.

In a further aspect of the present invention, an erase abort flag (EAF) in the first sector of the block can be marked after a successful erase operation. With these flags, the system can successful detect a write abort or an erase abort during next initialization of next power on. The write abort detection scheme is especially effective for multi-state memory: (1) it is more difficult and costly to design hardware to handle multi-state systems due to longer programming time required, and (2) the performance gained from not programming twice on every single sector is much greater on multi-state systems also due to longer programming time requirement.

Additional aspects, features and advantages of the present invention are included in the following description of exemplary embodiments, which description should be taken in conjunction with the accompanying drawings.

BRIEF DESCRIPTION OF THE DRAWINGS

FIG. 1 is a block diagram of a non-volatile memory system in which the various aspects of the present invention are described to be implemented;

FIG. 2 illustrates an existing circuit and organization of the memory array of FIG. 1 when a NAND type;

FIG. 3 shows a cross-sectional view, along a column, of a NAND type of memory array formed on a semiconductor substrate;

FIG. 4 is a cross-sectional view of the memory array of FIG. 3, taken at section 4-4 thereof;

FIG. 5 is a cross-sectional view of the memory array of FIG. 3, taken at section 5-5 thereof;

FIGS. 6A-C schematically shows the block structure according to the exemplary embodiments; and FIG. 7 is a flow chart of the exemplary write process.

DESCRIPTION OF EXEMPLARY EMBODIMENTS

Example Non-Volatile Memory System

With reference to FIGS. 1-7, a specific non-volatile memory system is described in which the various aspects of the present invention are implemented, in order to provide specific examples. To reduce the amount of disturb in erase processes, the present invention maintains the control gates of non-selected storage elements at the same voltage level as their underlying well structure. In a exemplary embodiment, the storage elements are formed over a well structure. During an erase process, both the selected and non-selected storage elements over the well are raised to an erase voltage concurrently with establishing this voltage level in the well. This voltage is then held on the well and the non-selected storage elements, thereby reducing the chance of any erase related disturbs, while the selected storage elements are allowed to discharge, producing the needed erase conditions. Further, this can be accomplished without increasing any pitch area of circuit or adding new wires in the memory array, resulting in minimal additional peripheral area being added to the circuit.

For specificity, the present invention is described for an EEPROM flash memory of the NAND type, although generalizations will be discussed further below. In particular, the present exposition will use the sort of system described in U.S. Pat. No. 6,522,580 and the other applications related to NAND systems that are incorporated by reference above. When specific voltages are needed in the following, the erase voltage $V_{erase}$ is taken to be in the 15-20 volt range, the low logic level is taken as ground, and the high logic level $V_{dd}$ taken in the 1.5-3 volt range, although other values can be used, depending on design.

FIG. 1 is a block diagram of a flash memory system. Memory cell array 1 including a plurality of storage units M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply a program voltages combined with the bit line potential levels controlled by the column control circuit 2, and to apply an erase voltage coupled with a voltage of p-type regions (labeled as "c-p-well" 11 in FIG. 3) on which the memory cells (M) are formed. The c-source control circuit 4 controls the common source lines (labeled as "c-source" in FIG. 2) connected to the memory cells (M). The c-p-well control circuit 5 controls the voltage of the c-p-well.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20. Command data for controlling the flash memory device are input to a command interface connected to external control lines, which are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, or a personal digital assistant. The host initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

With reference to FIG. 2, an example structure of the memory cell array 1 is described. A flash EEPROM of a NAND type is described as an example. The memory cells (M) are partitioned into a number of blocks, 1,024 in a specific example. The data stored in each block are simultaneously erased. The block is thus the minimum unit of a number of cells that are simultaneously erasable. In each block, there are N columns, N=8,512 in this example, that are divided into left columns and right columns, as described in further U.S. Pat. No. 6,522,580. The bit lines are also divided into left bit lines (BLL) and right bit lines (BLR).

Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first (Drain) select gate line (SGD), and another terminal is connected to the c-source via a second (Source) select transistor (S) which gate electrode is coupled to a second select gate line (SGS). Although four floating gate transistors are shown to be included in each cell unit, for simplicity, other numbers of transistors, such as 8, 16, or even 32, are used. FIG. 2 also includes a connection, C-p-well, for supplying the well voltage.

In each block, in this example, 8,512 columns are divided into even columns and odd columns. The bit lines are also divided into even bit lines (BLe) and odd bit lines (BLo). Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first select gate line (SGD), and another terminal is connected to the c-source via a second select transistor (S) which gate electrode is coupled to a second select gate line (SGS). Although, for simplicity, four floating gate transistors are shown to be included in each cell unit, a higher number of transistors, such as 8, 16 or even 32, are used.

In an alternate set of embodiments, as described in U.S. patent application Ser. No. 10/086,495, filed Feb. 27, 2002, which is hereby incorporated by reference, the array can be divided into left and right portions instead of the odd-even arrangement. The left and right sides may additionally have independent well structures with the right and left sides of the array each formed over such separate well structures, allowing the voltage levels to be set independently by the c-p-well control circuit 5 of FIG. 1. In a further variation, this could also allow erasure of a sub-block of less than all of the partitions of a block. Further variations that are compatible with the present invention are also described in application Ser. No. 10/086,495.

In the exemplary embodiments, the page size is 512 bytes, which is smaller than the cell numbers on the same word line. This page size is based on user preference and convention. Allowing the word line size to correspond to more than one page's worth of cells saves the X-decoder (row control circuit 3) space since different pages worth of data can share the decoders. During a user data read and programming operation, N=4,256 cells (M) are simultaneously selected in this example. The cells (M) selected have the same word line (WL), for example WL2, and the same kind of bit line (BL). Therefore, 532 bytes of data can be read or programmed simultaneously. This 532B data simultaneously read or programmed forms a "page" logically. Therefore, one block can store at least eight pages. When each memory cell (M) stores two bits of data, namely a multi-level cell, one block stores 16 pages in the case of two bit per cell storage. In this embodiment, the storage element of each of the memory cells, in this case the floating gate of each of the memory cells, stores two bits of user data.

FIG. 3 shows a cross sectional view of a NAND cell unit of the type shown schematically in FIG. 2, in the direction of the bit line (BL). At a surface of a p-type semiconductor substrate 9, a p-type region c-p-well 11 is formed, each of the left and right c-p-wells being enclosed by an n-type region 10 to electrically isolate the c-p-wells from the p-type substrate. The n-type region 10 is connected to a c-p-well line made of a first metal M0 via a first contact hole (CB) and an n-type diffusion layer 12. The p-type region c-p-well 11 is also connected to the c-p-well line via the first contact hole (CB) and a p-type diffusion layer 13. The c-p-well line is connected to the c-p-well control circuit 5 (FIG. 1).

The exemplary embodiment uses Flash EEPROM storage units, where each memory cell has a floating gate (FG) that stores an amount of electric charge corresponding to the data being stored in the cell, the word line (WL) forming the gate electrode, and drain and source electrodes made of the p-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (MO) via the second select transistor (S) and the first contact hole (CB). The common source line is connected to the c-source control circuit (4). The drain electrode is connected to the bit line (BL) made of a second metal (MI) via the first select transistor (S), the first contact hole (CB), an intermediate wiring of the first metal (M0) and a second contact hole (V1). The bit line is connected to the column control circuit (2).

FIGS. 4 and 5 show cross sectional views of a memory cell (section 4-4 of FIG. 3) and a select transistor (section 5-5 of FIG. 3), respectively, in the direction of the word line (WL2). Each column is isolated from the neighbor columns by a trench formed in the substrate and filled with isolation material, known as a shallow trench isolation (STI). The floating gates (FG) are isolated from each other by the STI and insulator film 15 and word line (WL). Since the gate electrode (SG) of the select transistor (S) is formed in the same formation process steps as the floating gate (FG) and word line (WL), it shows a stacked gate structure. These two select gate lines (SG) are shunted at the end of lines.

U.S. Pat. No. 6,522,580, that is incorporated by reference above describes the varoius voltages applied to operate the memory cell array 1, in a specific example, each memory cell's floating gate storing two bits, having one of the states "11", "10", "01", "00". This is reviewed briefly here for the case where the word line "WL2" and the bit lines of "BLe" are selected for erase, reading or programming. By raising the c-p-well to an erase voltage of $V_{erase}$=15-20V and grounding the word lines (WL) of a selected block, the data of the selected block is erased. Since all of the word lines (WL) of the unselected blocks, bit lines (BL), select lines (SG) and c-source are put in a floating state, these are also raised to almost $V_{erase}$ due to a capacitive coupling with the c-p-well. Therefore, a strong electric field is applied to only the tunnel oxide films 14 (FIGS. 4 and 5) of the selected memory cells (M), and the data of the selected memory cells are erased as a tunnel current flows across the tunnel oxide film 14. The erased cell is, in this example, one of the four possible programmed states, namely "11".

The high voltage values used in the erase and programming values can be generated from the lower supply values using a charge pump (not shown in FIG. 1). These higher voltage values can either be produced on the memory chip 22 itself, or supplied form another chip in the memory system. The use and location of the high voltage source is discussed more fully in U.S. Pat. No. 6,282,130, which is hereby incorporated by reference, and additional references cited therein.

FIG. 6 schematically illustrates such a prior art arrangement. Three representative word lines, $WL_A$, $WL_B$, and $WL_C$ are connected to a line 107 that supplies the various voltage levels through transistors 101, 103, and 105, respectively. The transistors 101, 103, and 105 together with line 107 would be part of the row control circuit 3 of FIG. 1. The c-p-well control circuit 5 of FIG. 1 provides the voltage for the well structure c-p-well 11. The word lines then continue on over the well structure 11 to any of the various word lines of the different blocks of memory 1 shown in FIG. 2. In a erase process, with word line $WL_C$ corresponding to a selected word line and $WL_A$ and $WL_B$ both non-selected, the voltage in the c-p-well is raised to the erase voltage of, say, 17 volts and line 107 is set to ground. The gate of transistor 105 is set to the high level of $V_{dd}$, taking word line $WL_C$ to ground, while both of transistors 101 and 103 are turned off by setting their gates to ground, leaving $WL_A$ and $WL_B$ to float. This results in the erase conditions described above, where the unselected erase gates are charged by capacitive couplings from the well (as is described, for example, in U.S. Pat. No. 5,546,341 incorporated above) and the selected erase gates are forced to ground. Other aspects of the erase process are described in U.S. patent application Ser. No. 09/956,201, filed Sep. 17, 2001, which is hereby incorporated by reference. In particular, U.S. patent application Ser. No. 09/956,201 describes a process where the non-selected word-lines can be floated, a process that can also be incorporated into alternate embodiments of the various aspects of the present invention.

In order to store electrons in the floating gate (FG) during a programming operation, the selected word line WL2 is connected to a program pulse Vpgrn and the selected bit lines BLe are grounded. On the other hand, in order to inhibit the program on the memory cells (M) in which programming is not to take place, the corresponding bit lines BLe are connected to $V_{dd}$ of a power supply, for example 3V, as well as the unselected bit lines BLo. The unselected word lines WL0, WL1 and WL3 are connected to 10V, the first select gate (SGD) is connected to $V_{dd}$, and the second select gate (SGS) is grounded. As a result, a channel potential of the memory cell (M) that is being programmed is set at 0V. The channel potential in the program inhibition is raised to around 6V as a result of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01", or "00".

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to $V_{dd}$ of a power supply, for example 3V, as well as the unselected bit lines BLo. The unselected word lines WL0, WL1 and WL3 are connected to 10V, the first select gate (SGD) is connected to $V_{dd}$, and the second select gate (SGS) is grounded. As a result, a channel potential of the memory cell (M) that is being programmed is set at 0V. The channel potential in the program inhibition is raised to around 6V because of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01", or "00".

In the read and verify operations, the select gates (SGD and SGS) and the unselected word lines (WL0, WL1 and WL3) are raised to a read pass voltage of 4.5V to make these as pass gates. The selected word line (WL2) is connected to a voltage level specified for each read and verify operation in order to determine whether a threshold voltage of the concerned memory cell has reached such level. For example, in a READ 10 operation, the selected word line WL2 is grounded, so that it is detected whether the threshold voltage is higher than 0V. In this read case, it can be said that a read level is 0V. In a VERIFY 01 operation, the selected word line WL2 is connected to 2.4V, so that it is verified that whether the threshold voltage has reached 2.4V. In this verify case, it can be said that a verify level is 2.4V. Again, for all of the described processes, the recited voltage levels are only exemplary values.

The selected bit lines (BLe) are pre-charged to a high level, for example 0.7V. If the threshold voltage is higher than the read or verify level, the potential level of the concerned bit line (BLe) maintains the high level, because of the non-conductive memory cell (M). On the other hand, If the threshold voltage is lower than the read or verify level, the potential level of the concerned bit line (BLe) decreases to a low level, for example less than 0.5V, because of the conductive memory cell (M). Further details of the read and verify operations are explained below.

Examples of Write/erase Abort Detection Mechanisms

A principal aspect of the present invention are techniques to ensure reliable mechanisms for write and erase abort detection in the event of lost of power during memory programming and erasing with minimized system performance penalty. When a specific embodiment is used for reference, he present invention will mainly be described in terms of the Flash type memory with a NAND architecture as described in the preceding section, although the ideas extend more generally as described further below.

One method known for preventing write abort is to add extra hardware to preserve memory Vdd until the memory operation is complete, such as is as is described in U.S. Pat. No. 5,418,752 that is hereby incorporated by this reference. In a variation, an alternate form of non-volatile memory with a faster write time can be used to store data which would be lost in a power loss situation. This approach has the disadvantages as it can be relatively costly and is not always readily implemented. Another method of write abort detection is to denote the address of the intended programming sector in the reserved area both before the actual programming operation and after the actual programming occurred in order to update the reserved area again to acknowledge the completion of programming operation. Including the actual programming of the data, this method will require three programming operations for every single sector write by the user. Another method is to write the predefined write abort header after the sector is programmed. This method will require two programming operations for every sector written. As for erase, one can write the address of the block or sector to be erased in a reserved area before erasing and write the address again to the reserved area after erase operation is completed. The main aspects of the present invention improve upon these techniques.

More specifically, to ensure a write abort failure can be reliably detected with minimal performance impact, a new write abort detection mechanism is introduced. In its exemplary embodiment, the algorithm introduces a Previous Sector Status flag (PSS) and a Last Sector Status flag (LSS) in the sector overhead information. Assuming the system is writing sectors 0 to x in a block, the algorithm will write the PSS of sector 1 to denote the data in sector 1 to denote sector 0 has completed programming and no write abort occurred. This allows the PSS flag to be protected by ECC, either the ECC for the whole sector including the overhead or the overhead ECC in embodiments that have this feature. Similarly, when the sector 2 is written, its PSS will be written to indicate that sector 1 completed programming without a write abort, and so on until the last sector of the write command is reached. When the last sector, sector x, is reached it will similarly have the PSS flag corresponding to sector (x−1) entered at the same time the sector x data is entered; as the last sector in the write, however, there will be no next sector in which to set a PSS flag corresponding the sector x. To account for this, the LSS flag is used. The LSS flag of a sector corresponds to the sector itself and indicates that the sector that contains it completed programming without a write abort.

After sector x is programmed, the algorithm can program LSS of sector x. This means only the last sector in the host program command requires two programming operation to ensure write abort detection. The PSS scheme is applied for all sectors within a host atomic write command or a group of commands cached by the controller. The LSS scheme applies to the last sector of the host atomic write command and the last physical page of a block if out of sequence page programming is not allowed. The memory system can determine the number of sectors to be programmed from the host command and, by utilizing host caching to manage the write operation with PSS and LSS, minimize system performance impact. For example, the controller can group multiple host atomic writes into one sequence of memory operation, thereby amortizing the overhead of writing LSS over a large chuck of sector and hence reducing the performance impact. These mechanisms ensure write abort failure detection by looking at the PSS of the next physical sector and at the LSS of the current sector if the sector is the last programmed sector in the block or the last physical sector of the block.

For erase, an erase abort flag (EAF) can be marked after a successful erase operation. The EAF flag can be placed in a pre-specified location, such as in the first sector of the block. Note that for both the PSS flag and the EAF flag (when a block contains more than a single sector), an indication of a successful operation in one sector is being maintained in another sector. With these flags, the system can successful detect a write abort or an erase abort during next initialization of next power on. These abort detection schemes are especially effective for multi-state (MLC) memories as it is more difficult and costly to design hardware to handle MLC due to the longer programming and erasing times required, and as the performance gained from not programming twice on every single sector is much greater on MLC also due to the typically longer programming time requirement.

The exemplary embodiment employs the PSS and LSS flags on a sector level basis. This is often convenient as a sector is the smallest data unit the host works with. More generally, a PSS and LSS flag can be set for each successful write for amounts of data, typically based on some physical data unit or structure. For example, when the unit of data writing is a multi-sector data page, the successful programming of a page of data can be recorded in the PSS flag programmed concurrently with the next page, with a LSS flag then being set for the successful write of the last page.

Although the present discussion of the exemplary embodiments is in terms of sectors—and the flag names include "sector"—, these embodiments can all be extended to the more general situation. Similarly, although the EAF flag for the exemplary embodiment is used on the block level, as this is the unit of erase, more generally it could also used on a different scale, such as a single erase flag for a meta-block.

A pair of exemplary embodiments are shown schematically in FIGS. 6A-C, with FIGS. 6A and 6C showing the structure of a sector and FIG. 6B describing the various fields. FIG. 6A represents a number n of blocks from memory array 1, where these run from block i 601 to block i+n 603. Within each block is shown a number of sectors, such as 631 and 633, each represented by a row in the figure. The various fields are described in FIG. 6B.

The various parts of a generic sector are noted in FIG. 6B. These consist of a data portion 611 where user data is stored and a header or overhead portion 623, which contains various data about the sector such as the corresponding error correction code (ECC) 615 and other sorts of overhead (Other 613) known in the art. The ECC may be for both the data and overhead or there may be a separate ECC for each. Although for exposition purposes the various fields are shown segregated in these Figures, in practice they may be intermingled in the actual storage elements. Additional, there are also embodiments where the overhead is stored separately, with physical sectors containing only data and other physical locations dedicated to overhead. The new features are the inclusion of the flags PSS 617, LSS 619, and EAF 621 in the overhead.

Returning to FIG. 6A, each sector has both a PSS flag 617, which can be set to indicate that the previous sector was successfully written, and a LSS flag 619, which can be set to indicate that the sector itself has been correctly written. As discussed below, each of these flags can consist of multiple bits. As the status of the PSS flag known before the sector is written, it is written concurrently with the data and overhead content and can be ECC protected. As the LSS flag is written subsequently, being dependent on the rest of the sector being successfully written, it will not be ECC protected, the ECC having been previous written.

As the contents of a block are all erased together, the exemplary embodiment can employ only a single erase abort flag for each block, EAF 621. The present invention adopts the convention that the EAF flag, which again can consist of multiple bits, is placed in the first sector of the block, such as sector 631 in block Block i 601. After an erase process is successfully completed, the EAF is set. Consequently, in the exemplary embodiment, the EAF flag should be set at all times. The only time it is not set is when an erase abort occurred where the operation to set the EAF flag did not occur after erase operation. As it will have already been set before data is written to the block, it will not be ECC protected. (If it is desired to have the EAF flag ECC protected, it would need to be erased and then rewritten with the data, incurring additional programming overhead.) Although the preferred embodiment includes both EAF flags for erase abort detection and PSS/LSS flags for write abort detection, it should be noted that these are independent aspects of the invention and can be independently incorporated into a memory device.

FIG. 6A shows the disposition of the status sector flags PSS 617 and LSS 619 at the successful conclusion of a write process starting at sector 0 631 of Block i 601 and running to sector 639 in Block i+n 603. The data portion 611 of each of these sectors will contain verified data as they have all been successfully written. In the overhead portion, only the status of the flags PSS 617, LSS 619, and EAF 621 is shown, with an X denoting a set flag and an open square indicating a flag not set. The content of the other parts of the overhead (613 and 615) is not shown. The data portion 611 can store either user data, as supplied from the host, or system data, examples of which are described in International patent publication WO 03/027828 A1, which is hereby incorporate by this reference.

The EAF flags 621 are set in the blocks as the blocks have previously been successfully erased without an erase abort occurring. The first written sector, 631, will have neither its PSS flag 617 nor its LSS flag 619 set. The next sector 633 will have its PSS flag 617 set indicating that preceding sector 631 was successfully written. Similarly, each succeeding sector, up to and including the last sector 639 of the write, will have its PSS flag set. The last written sector will additionally have its LSS flag 619 set, and be the only sector of the autonomous write process to have this flag set. (The situation of a sector having its LSS flag set, but its PSS flag unset, would occur if only the single sector is written.)

FIG. 7 is a flow chart of the exemplary write process. This begins at step 701 with the write command for writing multiple logical sectors of data. The first logical sector is then written into the corresponding physical sector (703). After the data is verified as correctly entered (705), the process continues on to the next sector. When the data content is written into the next sector (707), the PSS flag is also set in its overhead area to indicate that the previous sector was correctly programmed. The write is verified at step 709. If this is not the last sector (711, "NO"), the write process continues on to the next sector and repeats steps 707 and 709, again setting the PSS flag in step 707 in response to step 709 in the preceding loop. Once the last sector is written and confirmed (711, "YES"), since there is no next sector in which to set the PSS flag, the LSS flag is set in the last sector. The order in which sectors are written within a block, and the order in which blocks are written in an atomic write process may be fixed or variable, for example based on a pointer structure as in U.S. patent publication US 2003/0065899, which is hereby incorporated by reference. (If the order is not fixed, it will need to be maintained in order to determine which sector is the preceding sector corresponding to the PSS flag. As memories with a NAND architecture use a sequential sector write, the sequential write of sectors used in the scheme of FIG. 7 is a consequence.)

Returning to FIGS. 6A and 6B, to determine whether a write process was successful, only the PSS 617 and LSS 619 flags need to be checked. These flags can be used as a guarantee that the sectors were successful written. If the LSS flag of a sector is set, it and all of the preceding sectors of the write process were successfully programmed. For example, if there was a power loss during a write process, the flags can be scanned: if the LSS flag 619 is set, the programming was completed; if the LSS flag 619 is not set, by working backwards through the PSS flags 617, the first set PSS flag will indicate that all of the sectors in the write process were successfully written before the power was lost. Similarly, checking the EAF flag 621 allows for the determination that an erase process was successfully completed without having to check the data content of the entire block. It also allows the system to distinguish a block containing all valid data that just happens to be all zeros (which could also be determined by the PSS and LSS flags), and a block that is actually erased.

FIG. 6C is a variation on the embodiment of FIG. 6B that may be preferable in many applications. In this embodiment, when a complete block is written, the LSS flag is set for the last sector written in the block even when the write continues on to more sectors in other blocks. Consequently, the LSS flag of sector 635 is set in FIG. 6C. As the successful write of sector 635 is recorded in sector 635 itself, it is not necessary to set the PSS flag in the next written sector, which will be the first sector in another block. Thus, sector 637 does not have its PSS flag set even though the preceding sector was successfully written, this being indicated by the LSS flag of the last sector in the preceding block. As the first sector in each block will consequently never need to have its PSS flag set, this flag can be eliminated for these sectors, as is shown for sectors 631 and 637 in FIG. 6C. As these bits in sector 0, they can be used for EAF flag. Consequently, although the EAF flag 621 is shown as distinct in FIG. 6C, the area which would be used for PSS in the other sectors is available for EAF in sector 0.

The arrangement of FIG. 6C has the advantage that the status of all of the sectors in a block can be checked just by looking at the LSS flag of the last sector in the block. It also has the advantage the all of the sectors within a block will have the same number of data bits, as sector 0 is not required to have both a EAF and a PSS flag.

In the arrangement of FIG. 6C, the flowchart of FIG. 7 will be changed slightly in that in step 707 the PSS flag will not be set if the current sector is the first sector of a block. It will need to set LSS between steps 709 and 711 for the last sector of the block.

Considering the structure of the flags, these may be single bit flags or multi-bit flags. This is a design choice and is a tradeoff the robustness of the flags and the amount of space used. There is also the consideration that as the number bits in the flags increase, so does the probability of a bad bit or write error in the flag itself, which, as the purpose of the flags is to determine whether the data write was successful, becomes counter productive if the flag itself faces an increased risk of error. The exemplary embodiment uses flags of a few bits each, roughly matching the ECC used. Additionally, for added robustness, the flags may be stored in binary mode, even in a multi-state memory. As the PSS flag is set during the same MLC program operation as the actual data, using binary flags can complicate the programming algorithms somewhat and is also not needed in most applications as multi-bit flags can be used. In the exemplary embodiment described above, with the upper page/lower page, the flags are also preferably stored in a multi-level manner corresponding to an upper page flag and a lover age flag in order to reduce operating complexity.

As noted above, the present invention is applicable not just to the NAND type of flash memory of the exemplary embodiment, but to other architectures and memory technology. For example, other EEPROM or charge storing cells could benefit, e.g. a NOR type flash memory with well erase. It can similarly be extended to where the storage element is not a floating gate transistor, for example the dielectric storage element of the kind described in the U.S. patent application entitled "Multi-State Non-Volatile Integrated Circuit Memory Systems That Employ Dielectric Storage Elements", by Eliyahou Harari, George Samachisa, Jack H. Yuan, and Daniel C. Guterman, filed Oct. 25, 2002, which is hereby incorporated by this reference. And although the discussion so far has focused on embodiments using a charge storing device, such as floating gate EEPROM or FLASH cells, for the memory device, it can be applied to other embodiments, for example NROM and MNOS cells, such as those respectively described in U.S. Pat. No. 5,768, 192 of Eitan and U.S. Pat. No. 4,630,086 of Sato et al., or magnetic RAM and FRAM cells, such as those respectively described in U.S. Pat. No. 5,991,193 of Gallagher et al. and U.S. Pat. No. 5,892,706 of Shimizu et al., all of which are hereby incorporated herein by this reference, could also be used.

Although the various aspects of the present invention have been described with respect to specific embodiments, it will be understood that the invention is protected within the full scope of the appended claims.

The invention claimed is:

1. A non-volatile memory comprising a plurality of data storage areas, each of the data storage areas containing:
   a user data portion; and
   an overhead data portion, wherein the overhead data portion of each data storage area contains a first flag for indicating that another one of the data storage areas is correctly written and a second flag for indicating that the data storage area itself is correctly written,
   wherein the data storage areas are organized into a plurality of units of erase, and wherein each of said blocks further contains an additional data storage area, the overhead data portion of which having said second flag and not having said first flag.

2. The non-volatile memory of claim 1, wherein the overhead data portion of each of said data storage areas not having said first flag contains a third flag for indicating that the unit of erase to which the data storage areas not having said first flag belongs has had an erase operation completed.

3. The non-volatile memory of claim 2, wherein said data storage areas are written according to a predetermined sequence, wherein said another one of the data storage areas is the preceding data storage area in the sequence, and wherein said data storage areas not having said first flag are the first data storage areas in said sequence in the respective blocks to which they belong.

4. A memory, comprising:
   a non-volatile memory comprising a plurality of data storage areas; and
   a controller for the reading and writing of data to the memory, wherein during a sequential write process of data into two or more of said data storage areas, for each data storage area subsequent to the first, an indication of the write of the preceding data storage area is written into the current data storage area as part of its write process.

5. The memory of claim 4, wherein during the sequential write process, for the last of the data storage areas in the sequential process, an indication of the write of the last of the data storage areas is written into the last of the data storage areas.

6. The memory of claim 5, wherein each of said data storage areas includes a data portion and an overhead portion, and wherein said indications are written into the overhead portion.

7. A method of operating a non-volatile memory, comprising:
   programming first content including user data into a first data storage area;
   verifying that the first content is correctly programmed in the first data storage area;
   subsequently programming second content including user data into a second data storage area; and
   concurrently with said programming second content, writing to the second data storage area an indication that the first data storage area is correctly programmed.

8. The method of claim 7, further comprising:
   subsequent to said programming second content, verifying that the second content is correctly programmed in the second data storage area; and
   subsequently writing to the second data storage area an indication that the second data storage area is correctly programmed.

9. The method of claim 7, wherein the data storage areas are written in a predetermined order.

10. The method of claim 9, wherein data storage area are grouped into units of erase, the method further comprising:
    subsequent to said programming second content, verifying that the second content is correctly programmed in the first data storage area; and
    subsequently writing to the second data storage area an indication that the second data storage area is correctly programmed when said second data storage is the last of the data storage areas written in the predetermined order in the unit of erase to which the second data storage area belongs.

11. The method of claim 7, wherein the second content and the indication that the first data storage area is correctly programmed are protected by error correction code (ECC).

12. A method of determining if a plurality of sequentially written sectors have been correctly programmed, comprising:
    determining if every sector but the initial sector in the sequence was correctly programmed based on the content of the following sector;
    finding a first sector not indicated to be correctly programmed based upon content of the subsequent sector; and
    based on the content of the first sector itself, determining if the first sector is correctly programmed.

13. The method of claim 12, wherein said content of the following sector includes a flag indicating that the preceding sector is correctly programmed.

14. The method of claim 13, wherein said flag indicating that the preceding sector is correctly programmed is comprised of multiple bits.

15. The method of claim 13, wherein said flag indicating that the preceding sector is correctly programmed is protected by error correction code (ECC).

16. The method of claim 12, wherein said content of the first sector itself includes a flag indicating that the first sector is correctly programmed.

17. The method of claim 16, wherein said flag indicating that the first sector is correctly programmed is comprised of multiple bits.

18. A method of operating a non-volatile memory having a plurality of sectors each having a data portion and an overhead portion, comprising:
    altering the data content of at least a first sector;
    subsequently verifying that said altering the data content of at least a first sector is successfully completed; and
    subsequently recording in the overhead portion of a second sector an indication that said altering the data content of at least a first sector is successfully completed.

19. The method of claim 18, wherein said altering the data content is a programming operation.

20. The method of claim 18, wherein the first and second sectors belong to the same block and said altering the data content is an erase operation.

* * * * *